United States Patent
Garrity et al.

(10) Patent No.: US 11,276,938 B2
(45) Date of Patent: Mar. 15, 2022

(54) SINGLE LAYER ANTENNA

(71) Applicant: Semtech Corporation, Camarillo, CA (US)

(72) Inventors: Paul James Garrity, Rockwall, TX (US); Ross Elliot Teggatz, The Colony, TX (US); Antony Eugene Brinlee, Plano, TX (US)

(73) Assignee: SEMTECH CORPORATION, Camarillo, CA (US)

( * ) Notice: Subject to any disclaimer, the term of this patent is extended or adjusted under 35 U.S.C. 154(b) by 220 days.

(21) Appl. No.: 16/229,120

(22) Filed: Dec. 21, 2018

(65) Prior Publication Data
US 2019/0214735 A1   Jul. 11, 2019

Related U.S. Application Data

(60) Provisional application No. 62/616,323, filed on Jan. 11, 2018.

(51) Int. Cl.
*H01Q 1/48*   (2006.01)
*H01Q 13/10*   (2006.01)
(Continued)

(52) U.S. Cl.
CPC ....... *H01Q 13/10* (2013.01); *G06K 19/07786* (2013.01); *H01Q 1/2225* (2013.01);
(Continued)

(58) Field of Classification Search
CPC ............ H01Q 1/243; H01Q 1/38; H01Q 1/48; H01Q 13/106
See application file for complete search history.

(56) References Cited

U.S. PATENT DOCUMENTS 6,404,395 B1 * 6/2002 Masuda ................. H01Q 1/243
343/700 MS
6,535,167 B2   3/2003 Masuda et al.
(Continued)

FOREIGN PATENT DOCUMENTS

CN   107796294   3/2018
CN   107919322   4/2018
(Continued)

OTHER PUBLICATIONS

Extended European Search Report for EP Application No. 19151276.3 dated May 31, 2019 by the European Patent Office, 9 pages.
(Continued)

*Primary Examiner* — Hasan Islam
(74) *Attorney, Agent, or Firm* — Jackson Walker LLP; Christopher J. Rourk

(57) ABSTRACT

An antenna is disclosed that includes a ground plane extending in a first direction on a substrate and a radiating element occupying a same plane as the ground plane on the substrate, and coupled to the ground plane, the radiating element comprising a first portion with a first end and a second end extending in a substantially parallel direction to the ground plane, a feed line coupled to the first end of the first portion of the radiating element and extending in a substantially perpendicular direction from the first portion of the radiating element and a second portion having a third end and a fourth end, wherein the third end is coupled to the ground plane and the fourth end is coupled to the radiating element at a point between the first end and the second end.

20 Claims, 4 Drawing Sheets

(51) Int. Cl.
 *H01Q 1/38* (2006.01)
 *H05K 1/02* (2006.01)
 *H01Q 9/04* (2006.01)
 *H01Q 1/22* (2006.01)
 *H01Q 5/357* (2015.01)
 *G06K 19/077* (2006.01)

(52) U.S. Cl.
 CPC .............. *H01Q 1/38* (2013.01); *H01Q 1/48* (2013.01); *H01Q 5/357* (2015.01); *H01Q 9/0421* (2013.01); *H01Q 13/106* (2013.01); *H05K 1/0237* (2013.01); *H05K 2201/09063* (2013.01)

(56) References Cited

U.S. PATENT DOCUMENTS

| | | | |
|---|---|---|---|
| 6,662,028 B1 * | 12/2003 | Hayes | ............... H01Q 1/243 343/908 |
| 6,687,774 B2 | 2/2004 | Milios et al. | |
| 7,079,079 B2 * | 7/2006 | Jo | ................... H01Q 1/243 343/700 MS |
| 7,155,193 B2 | 12/2006 | Rowe et al. | |
| 7,221,251 B2 | 5/2007 | Menegoli et al. | |
| 7,826,542 B2 | 11/2010 | Rowe | |
| 7,848,367 B2 | 12/2010 | Hornbuckle et al. | |
| 7,965,988 B2 | 6/2011 | Cole et al. | |
| 7,973,689 B2 | 7/2011 | Glass et al. | |
| 8,212,699 B1 | 7/2012 | Nilsson et al. | |
| 8,461,847 B2 | 6/2013 | Teggatz et al. | |
| 8,587,486 B2 * | 11/2013 | Chiu | ................... H01Q 5/378 343/702 |
| 8,593,352 B2 | 11/2013 | Tseng et al. | |
| 8,653,741 B2 | 2/2014 | Monney | |
| 9,219,427 B2 | 12/2015 | Aebischer | |
| 9,252,834 B2 | 2/2016 | Seller et al. | |
| 9,368,858 B2 | 6/2016 | Lin | |
| 9,515,651 B2 | 12/2016 | Teggatz et al. | |
| 9,542,050 B2 | 1/2017 | Monney | |
| 9,582,111 B2 | 2/2017 | Rouaissia et al. | |
| 9,601,461 B2 | 3/2017 | Ho et al. | |
| 9,628,594 B2 | 4/2017 | Rouaissia | |
| 9,692,364 B2 | 6/2017 | D'Souza et al. | |
| 9,787,364 B2 | 10/2017 | Moore et al. | |
| 9,794,095 B2 | 10/2017 | Somin et al. | |
| 9,800,288 B2 | 10/2017 | Seller et al. | |
| 9,819,892 B2 | 11/2017 | Latremouille | |
| 9,864,464 B2 | 1/2018 | Rouaissia et al. | |
| 10,128,560 B2 * | 11/2018 | Heng | ................ H01Q 1/44 |
| 10,136,399 B1 | 11/2018 | Rouaissia | |
| 2004/0108957 A1 | 6/2004 | Umehara et al. | |
| 2007/0103367 A1 * | 5/2007 | Wang | ................ H01Q 5/371 343/700 MS |
| 2008/0070520 A1 | 3/2008 | Mitter et al. | |
| 2012/0050114 A1 * | 3/2012 | Li | ............... H01Q 1/24 343/702 |
| 2012/0176275 A1 * | 7/2012 | Horisawa | ........... H01Q 9/0421 343/700 MS |
| 2012/0249393 A1 * | 10/2012 | Hotta | ................ H01Q 7/00 343/843 |
| 2013/0257171 A1 | 10/2013 | Teggatz et al. | |
| 2014/0097887 A1 | 4/2014 | Aebischer | |
| 2014/0159990 A1 * | 6/2014 | Azhari | ................ H01Q 1/38 343/878 |
| 2014/0225447 A1 | 8/2014 | Teggatz | |
| 2014/0361941 A1 * | 12/2014 | Jenwatanavet | ........ H01Q 5/328 343/722 |
| 2017/0156030 A1 | 6/2017 | Peng | |
| 2018/0019194 A1 | 1/2018 | Papillon | |
| 2018/0034506 A1 | 2/2018 | Moore et al. | |
| 2018/0284215 A1 | 10/2018 | Peng | |
| 2018/0329575 A1 | 11/2018 | Rouaissia et al. | |
| 2018/0331706 A1 | 11/2018 | Nys et al. | |
| 2018/0358965 A1 | 12/2018 | Rouaissia et al. | |
| 2018/0375515 A1 | 12/2018 | Ott, III et al. | |

FOREIGN PATENT DOCUMENTS

| | | |
|---|---|---|
| EP | 3173807 | 5/2017 |
| EP | 3206228 | 8/2017 |
| EP | 3273607 | 1/2018 |
| EP | 3002896 | 5/2018 |
| EP | 3187898 | 8/2018 |
| EP | 3264622 | 3/2019 |
| KR | 20170131270 | 11/2017 |
| WO | 2016019139 | 2/2016 |

OTHER PUBLICATIONS

Examination Report dated May 25, 2020 from the European Patent Office for EP Application No. 19151276.3, 7 pages.
Response to Office Action dated May 25, 2020 from the European Patent Office for co-pending EP Patent Application No. 19151276.3 as-filed on Nov. 30, 2020, 13 pages.

* cited by examiner

SINGLE LAYER ANTENNA

RELATED APPLICATIONS

The present application claims priority to and benefit of U.S. Provisional Patent Application No. 62/616,323, filed Jan. 11, 2018, which is hereby incorporated by reference for all purposes as if set forth herein in its entirety.

TECHNICAL FIELD

The present disclosure relates generally to antennas and, more specifically, to a single-layer planar antenna.

BACKGROUND OF THE INVENTION

Planar antennas that are used in conjunction with printed circuits are known. One type of planar antennas used with printed circuits is the inverted-F antenna. One feature common to planar antennas used with printed circuits is their multi-layer structure, where the antennas must occupy more than one layer of the circuit. Typically, one layer of the circuit board forms a ground plane and another layer forms the antenna, while circuit board vias are used to connect the antenna to the ground plane at desired places.

SUMMARY OF THE INVENTION

An antenna is disclosed that includes a ground plane extending in a first direction on a substrate and a radiating element occupying a same plane as the ground plane on the substrate and coupled to the ground plane. The radiating element includes a first portion with a first end and a second end, the first portion extending in a substantially parallel direction to the ground plane. The radiating element also includes a feed line coupled to the first end of the first portion of the radiating element and extending in a substantially perpendicular direction from the first portion of the radiating element. The radiating element also includes a second portion having a third end and a fourth end. The third end of the second portion is coupled to the ground plane, and the fourth end is coupled to the radiating element at a point between the first end and the second end.

Other systems, methods, features, and advantages of the present disclosure will be or become apparent to one with skill in the art upon examination of the following drawings and detailed description. It is intended that all such additional systems, methods, features, and advantages be included within this description, be within the scope of the present disclosure, and be protected by the accompanying claims.

BRIEF DESCRIPTION OF THE SEVERAL VIEWS OF THE DRAWINGS

Aspects of the disclosure can be better understood with reference to the following drawings. The components in the drawings may be to scale, but emphasis is placed upon clearly illustrating the principles of the present disclosure. Moreover, in the drawings, like reference numerals designate corresponding parts throughout the several views, and in which.

DETAILED DESCRIPTION OF THE INVENTION

Figure 1A:
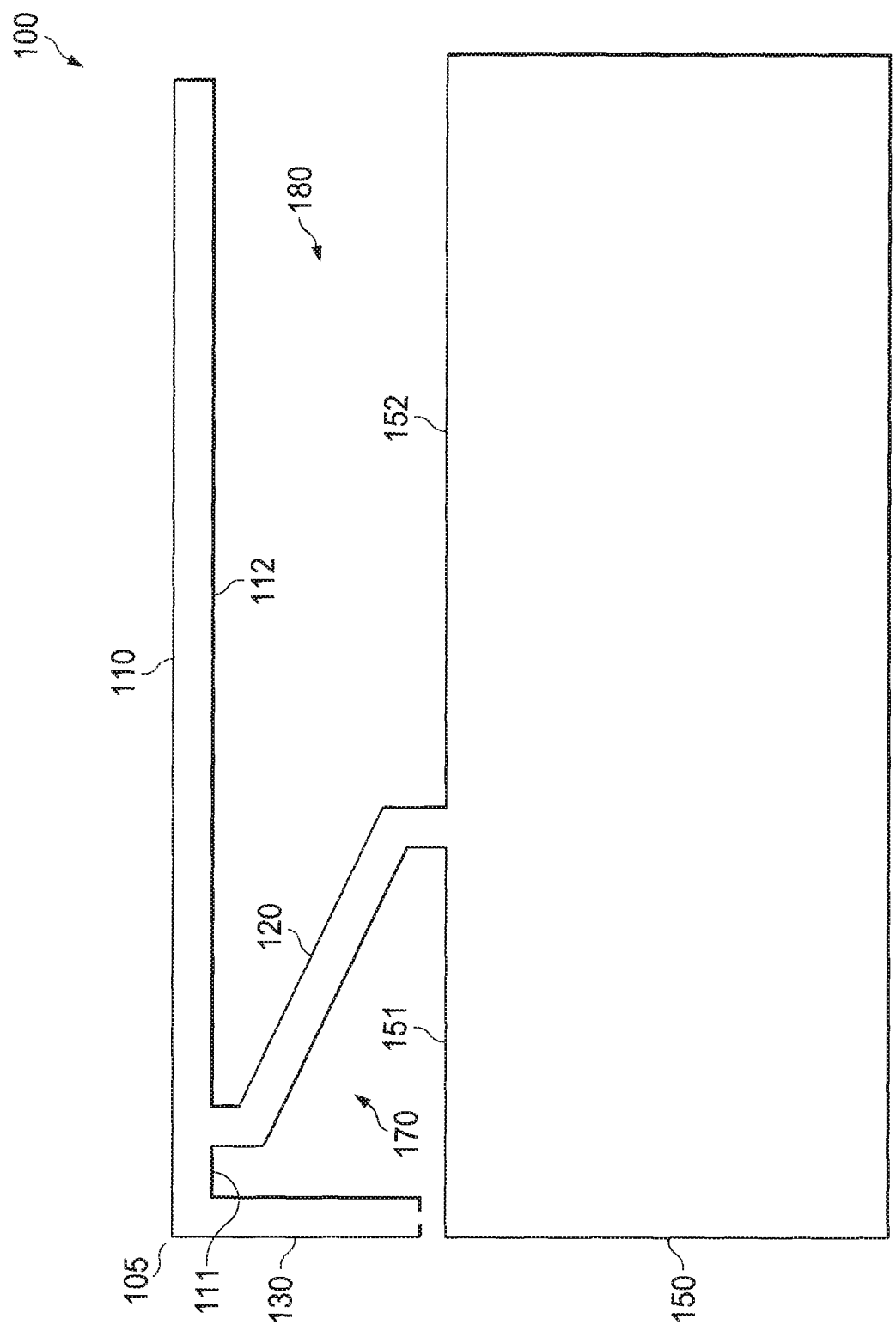
FIG. 1A is a diagram of an antenna, in accordance with an example embodiment of the present disclosure.

In the description that follows, like parts are marked throughout the specification and drawings with the same reference numerals. The drawing figures may be to scale and certain components can be shown in generalized or schematic form and identified by commercial designations in the interest of clarity and conciseness.

While multi-layer circuit boards are common, a single-layer circuit board that performs the same function as a multi-layer circuit board can drive down cost. Printing circuits with screen or ink-jet printers enables the production of low-cost flexible single-layer circuits, and while standard planar antenna designs do not perform correctly with single-layer circuits because the feed line divides the plane of the circuit and can also interfere with correct operation of the driver integrated circuit, the present disclosure solves those problems, as discussed herein.

In particular, the present disclosure solves the above-described problems and provides a distinct advance to the design of planar antennas intended for use in single-layer circuits. Specifically, the present disclosure includes a planar antenna that includes a ground plane that extends in a first direction on a substrate and a radiating element that occupies the same plane as the ground plane on the substrate and that is coupled to the ground plane, where the radiating element includes a first portion with a first end and a second end extending in a substantially parallel direction to the ground plane. A feed line adjoins the first end of the first portion of the radiating element and extends in a substantially perpendicular direction from the first portion of the radiating element. A second portion has a third end and a fourth end, where the third end is coupled to the ground plane and the fourth end is coupled to the radiating element at a point between the first end and the second end.

In one example embodiment, the first portion of the radiating element is of a length equal to one quarter of the wavelength to be transmitted. In another example embodiment, the second portion of the radiating element adjoins the first portion of the radiating element or the ground plane at a 90 degree angle.

In a third example embodiment, an electrical system includes a transmitting element and a single-layer printed circuit. The single-layer printed circuit includes a single layer of conductive material that has component pads, circuit connections, a ground plane extending in a first direction and an antenna. The antenna includes a radiating element coupled to the ground plane, where the radiating element includes a first portion with a first end and a second end extending in a substantially parallel direction to the ground plane. A feed line adjoins the first end of the first portion of the radiating element and extends in a substantially perpendicular direction from the first portion of the radiating element. A second portion has a third end and a fourth end, such that the third end is coupled to the ground plane and the fourth end is coupled to the radiating element at a point between the first end and the second end.

FIG. 1A is a diagram of an antenna 100, in accordance with an example embodiment of the present disclosure.

Antenna 100 includes radiating element 105 and ground plane 150, and can be fabricated from metal, metal film, printed conductive material or other suitable materials.

Radiating element 105 includes first portion 110, second portion 120, and feed line 130. First portion 110 of radiating element 105 can have a length L that is one-quarter of the wavelength of the desired transmission or reception frequency. Feed line 130 adjoins one end of first portion 110. One side of second portion 120 adjoins first portion 110 at a point between its ends, dividing first portion 110 into sections 111 and 112. The other side of second portion 120 is coupled to ground plane 150, dividing the edge of the ground plane closest to radiating element 105 into sections 151 and 152.

Slot antenna 170 is formed by section 111, second portion 120, feed line 130, and section 151, and can have dimensions that are selected so as to maximize the power transmitted by radiating element 105 at a frequency corresponding to a wavelength of four times the length L of first portion 110. A feed point can be determined as a function of a desired impedance for the circuit, where the real and imaginary components of the impedance can be changed by moving second portion 120 to change the length of sections 111 and 112. A slot antenna can generally be made to resonate, even though resonance can result in a loss of efficiency. Efficiency can vary from a higher value at a full wave length to a substantially lower value at less than 1/32 of a wavelength, where the length of the radiating arm of portion 110 is trimmed to resonate at a desired frequency.

Figure 1B:
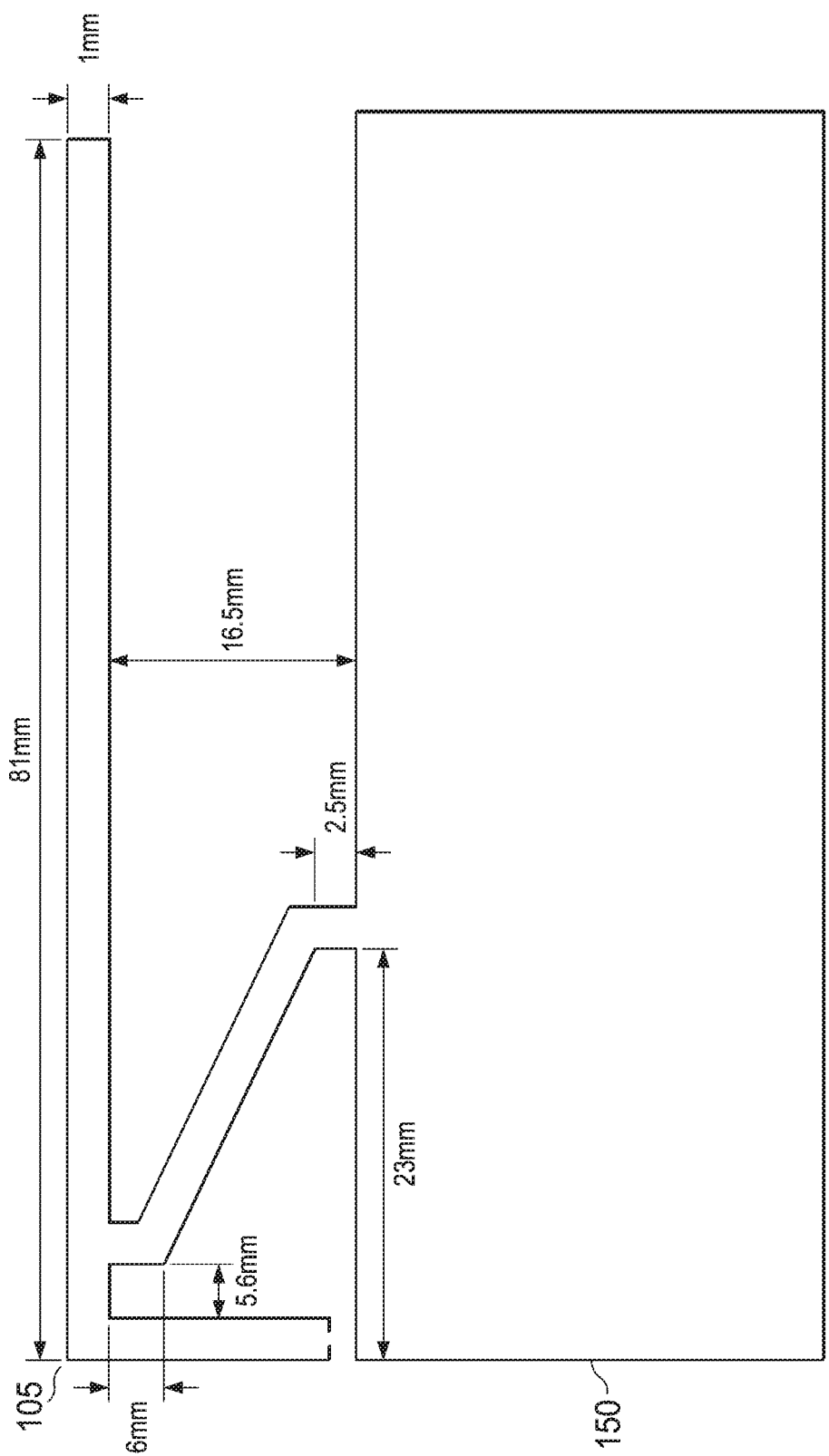
FIG. 1B is a diagram showing dimensions of an antenna, in accordance with an example embodiment of the present disclosure.

FIG. 1B is a diagram showing dimensions of an antenna 100, in accordance with an example embodiment of the present disclosure. The length "L" can be 81 mm, and the length of the perimeter of the slot antenna can be approximately 71 mm, but the slot antenna can has dimensions that maximize the power transmitted by radiating element 105 at a frequency corresponding to a wavelength of four times 81 mm.

Figure 2:
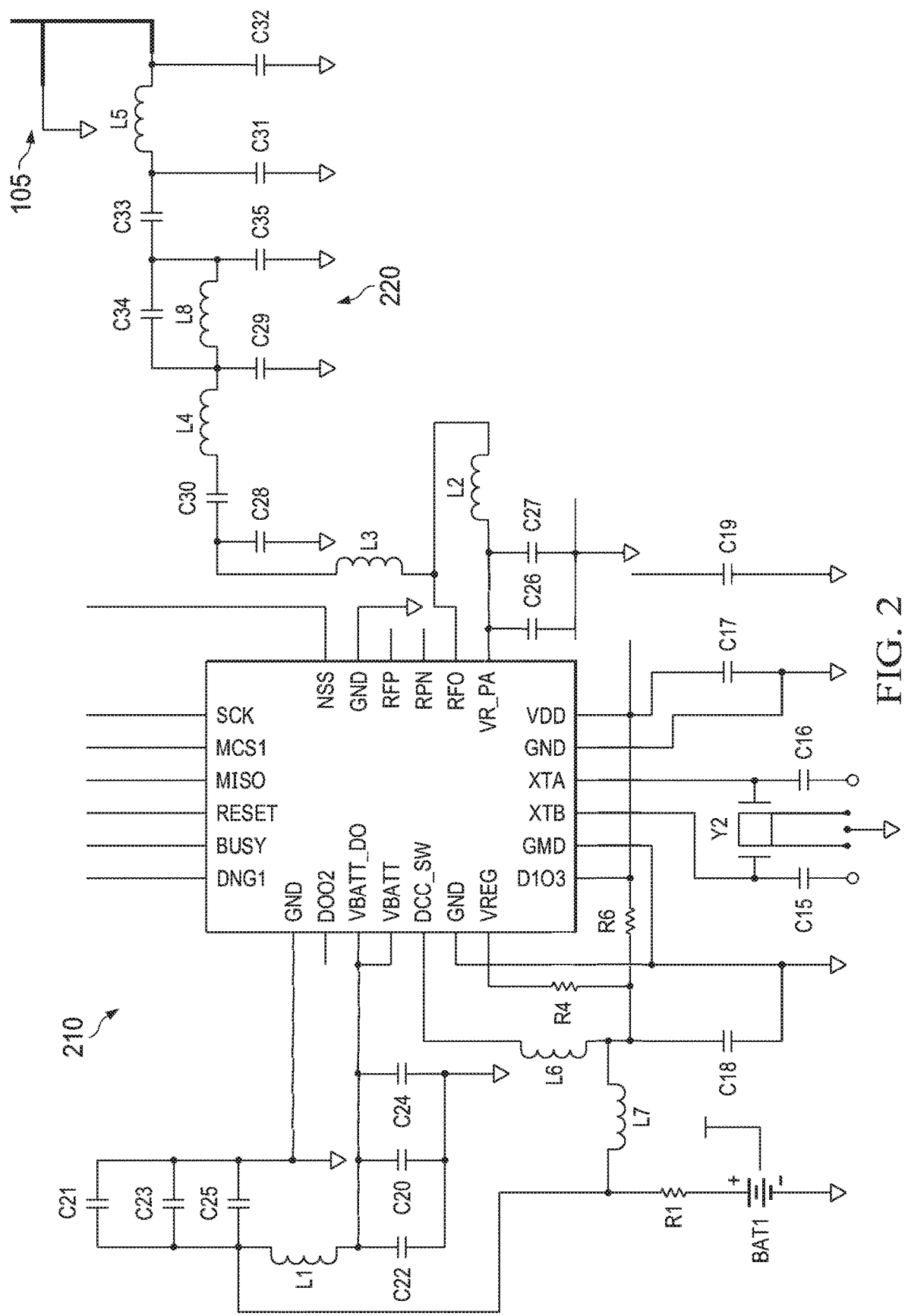
FIG. 2 is a diagram of a transmitting circuit coupled to an antenna, in accordance with an example embodiment of the present disclosure.

FIG. 2 shows a transmitting circuit 210 coupled to an antenna, in accordance with an example embodiment of the present disclosure. Transmitting circuit 210 can be implemented in hardware or a suitable combination of hardware and software, such as using a controller that implements the algorithms disclosed herein.

Transmitting circuit 210 feeds transmission power to radiating element 105 through filter network 220. Filter network 220 consists of inductors L4, L5 and L8 and capacitors C29, C30, C31, C32, C33 and C34, which are configured to match the impedance of antenna 100 (which comprises radiating element 105 and ground plane 150) at a predetermined transmission frequency, to maximize a transmitted signal amplitude.

Transmitting circuit 210 can be constructed as a single-layer printed circuit from discrete components, as an application-specific integrated circuit, as a combination of discrete components and integrated circuits or in other suitable embodiments. A single-layer printed circuit can use a single layer of conductive material for circuit connections (traces) and component pads, discrete electrical components, jumper wires to cross over a trace and other suitable components. A single-layer circuit does not have more than one layer of conductive material for purposes of mounting electrical components or connecting pins of various electrical components, and therefore do not require conductive vias between layers of conductive material, because there is only a single layer of conductive material.

Single-layer circuits offer at least two distinct advantages over multiple-layer circuits. First, single-layer circuits are less expensive than multi-layer circuits. Second, single-layer circuits can utilize a greater variety of fabrication techniques than multi-layer circuits. For example, the use of single-layer circuits simplifies printing techniques that use a screening process or an ink-jet printer.

Figure 3:
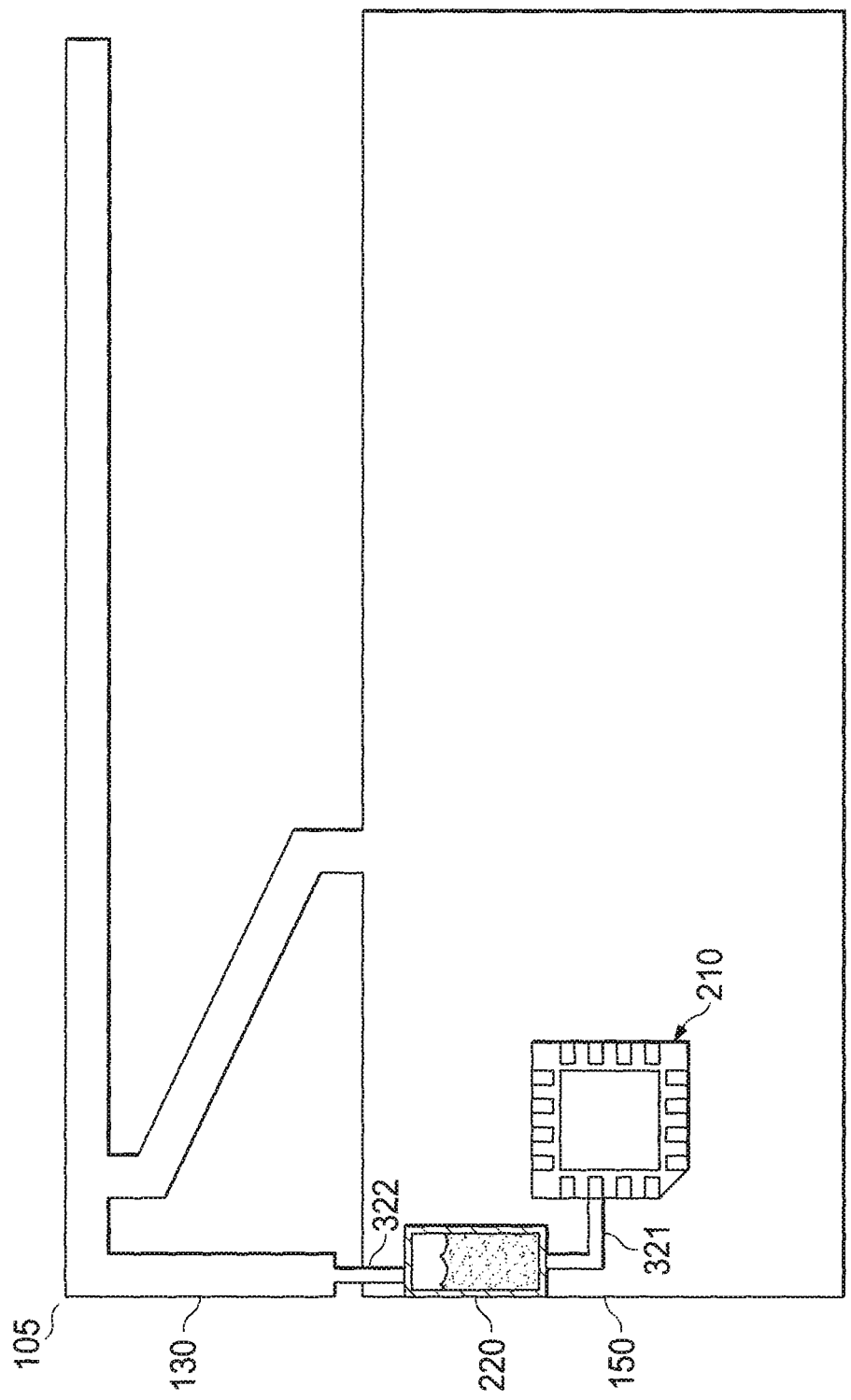
FIG. 3 is a diagram of circuit components of a printed circuit comprising an antenna, in accordance with an example embodiment of the present disclosure.

FIG. 3 is a diagram 300 of circuit components of a printed circuit comprising an antenna, in accordance with an example embodiment of the present disclosure. Transmitter integrated circuit 210 is coupled to filter network 220 through conductive trace 321. Filter network 220 is coupled to feeder line 130 through conductive trace 322. In one example embodiment, the pads for soldering transmitter integrated circuit 210, the components in filter network 220, and the other electronic parts of the transmitter circuit, as well as the conductive traces for the transmitter circuit, can be formed from conductive material that would have otherwise been used for ground plane 150. A thin outline of conductive material around these conductive traces and pads can be removed to provide insulation between the conductive traces or pads to the ground plane, except for cases in which the conductive traces or pads are configured to be the same potential as the ground plane (i.e. an intentional ground connection).

It should be noted that all of transmitter integrated circuit 210 occupies space on the printed circuit to the right of the electrical feeder path comprising trace 321, filter network 220, and trace 322. That is, the electrical feeder path coupled between feeder line 130 and transmitter integrated circuit 210 does not cause any parasitic coupling between different sections of transmitter integrated circuit 210 to radiating element 105, as would have been the case for antenna designs that have a feeder line coupled to the middle of the radiating antenna, such as a standard inverted-F antenna. The embodiments shown in the present disclosure include feeder lines coupled to the end of radiating element 105.

Other suitable alternatives will occur to a person skilled in the art. For example, second portion 120 of radiating element 105 could take on other shapes such as a line segment perpendicular to first portion 110 or a line segment at an angle other than 90 degrees with respect to first portion 110. Those skilled in the art should understand that the previously described embodiments of the transmitting tag and related methods of operating the same are submitted for illustrative purposes only.

As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof. As used herein, the term "and/or" includes any and all combinations of one or more of the associated listed items. As used herein, phrases such as "between X and Y" and "between about X and Y" should be interpreted to include X and Y. As used herein, phrases such as "between about X and Y" mean "between about X and about Y." As used herein, phrases such as "from about X to Y" mean "from about X to about Y."

As used herein, "hardware" can include a combination of discrete components, an integrated circuit, an application-specific integrated circuit, a field programmable gate array, or other suitable hardware. As used herein, "software" can include one or more objects, agents, threads, lines of code, subroutines, separate software applications, two or more lines of code or other suitable software structures operating in two or more software applications, on one or more processors (where a processor includes one or more microcomputers or other suitable data processing units, memory devices, input-output devices, displays, data input devices such as a keyboard or a mouse, peripherals such as printers and speakers, associated drivers, control cards, power sources, network devices, docking station devices, or other suitable devices operating under control of software systems in conjunction with the processor or other devices), or other suitable software structures. In one exemplary embodiment, software can include one or more lines of code or other suitable software structures operating in a general purpose software application, such as an operating system, and one or more lines of code or other suitable software structures operating in a specific purpose software application. As used herein, the term "couple" and its cognate terms, such as "couples" and "coupled," can include a physical connection (such as a copper conductor), a virtual connection (such as through randomly assigned memory locations of a data memory device), a logical connection (such as through logical gates of a semiconducting device), other suitable connections, or a suitable combination of such connections. The term "data" can refer to a suitable structure for using, conveying or storing data, such as a data field, a data buffer, a data message having the data value and sender/receiver address data, a control message having the data value and one or more operators that cause the receiving system or component to perform a function using the data, or other suitable hardware or software components for the electronic processing of data.

In general, a software system is a system that operates on a processor to perform predetermined functions in response to predetermined data fields. For example, a system can be defined by the function it performs and the data fields that it performs the function on. As used herein, a NAME system, where NAME is typically the name of the general function that is performed by the system, refers to a software system that is configured to operate on a processor and to perform the disclosed function on the disclosed data fields. Unless a specific algorithm is disclosed, then any suitable algorithm that would be known to one of skill in the art for performing the function using the associated data fields is contemplated as falling within the scope of the disclosure. For example, a message system that generates a message that includes a sender address field, a recipient address field and a message field would encompass software operating on a processor that can obtain the sender address field, recipient address field and message field from a suitable system or device of the processor, such as a buffer device or buffer system, can assemble the sender address field, recipient address field and message field into a suitable electronic message format (such as an electronic mail message, a TCP/IP message or any other suitable message format that has a sender address field, a recipient address field and message field), and can transmit the electronic message using electronic messaging systems and devices of the processor over a communications medium, such as a network. One of ordinary skill in the art would be able to provide the specific coding for a specific application based on the foregoing disclosure, which is intended to set forth exemplary embodiments of the present disclosure, and not to provide a tutorial for someone having less than ordinary skill in the art, such as someone who is unfamiliar with programming or processors in a suitable programming language. A specific algorithm for performing a function can be provided in a flow chart form or in other suitable formats, where the data fields and associated functions can be set forth in an exemplary order of operations, where the order can be rearranged as suitable and is not intended to be limiting unless explicitly stated to be limiting.

It should be emphasized that the above-described embodiments are merely examples of possible implementations. Many variations and modifications may be made to the above-described embodiments without departing from the principles of the present disclosure. All such modifications and variations are intended to be included herein within the scope of this disclosure and protected by the following claims.

What is claimed is:

1. A device comprising:
    a ground plane extending in a horizontal direction on a substrate; and
    an inverted F antenna occupying a same plane as the ground plane on the substrate, and coupled to the ground plane, the inverted F antenna comprising:
        a horizontal radiating element with a first end and a second end extending in a parallel direction to the ground plane;
        a feed line directly connected to the first end of the radiating element and extending in a perpendicular direction from the first end of the radiating element;
        a slanted grounding element having a third end and a fourth end, wherein the third end is connected to the ground plane at a 90-degree angle using a first extending portion and the fourth end is connected to the radiating element at a 90-degree angle using a second extending portion at a point between the first end and the second end; and
        a transmitter integrated circuit coupled to the feed line through a filter network by an electrical feeder path, said feeder path including two conductive traces;
        said transmitter integrated circuit occupies space on the ground plane on a same side of the electrical feeder path, such that the electrical feeder path does not cause any parasitic coupling between the transmitter integrated circuit and the radiating element;
        wherein the inverted F antenna is a single layer antenna.

2. The device of claim 1, wherein the slanted grounding element is coupled to the radiating element at a 90 degree angle.

3. The device of claim 1, wherein the slanted grounding element is coupled to the ground plane at a 90 degree angle.

4. The device of claim 1, further comprising a slot antenna formed by a perimeter of an area enclosed by the radiating element, the feed line, the ground plane, and the slanted grounding element.

5. The device of claim 4, wherein the slot antenna is configured to operate at one quarter of a wavelength of a frequency of the inverted F antenna.

6. The device of claim 1, wherein the radiating element is of a length equal to a rational number times a wavelength of the inverted F antenna.

7. The device of claim 1, wherein the slanted grounding element is coupled to the radiating element at a 90 degree angle and the slanted grounding element is coupled to the ground plane at a 90 degree angle.

8. A printed circuit comprising:
a ground plane extending in a horizontal direction on a substrate; and
an inverted F antenna coplanar with the ground plane on the substrate, and coupled to the ground plane, the inverted F antenna comprising:
a horizontal radiating element with a first end and a second end extending in a parallel direction to the ground plane;
a feed line directly connected to the first end of the radiating element and extending in a perpendicular direction from the first end of the radiating element;
a slanted grounding element having a third end and a fourth end, wherein the third end is connected to the ground plane at a 90-degree angle using a first extending portion and the fourth end is connected to the radiating element at a 90-degree angle using a second extending portion at a point between the first end and the second end; and
a transmitter integrated circuit coupled to the feed line through a filter network by an electrical feeder path, said feeder path including two conductive traces;
said transmitter integrated circuit occupies space on the ground plane on a same side of the electrical feeder path, such that the electrical feeder path does not cause any parasitic coupling between the transmitter integrated circuit and the radiating element;
wherein the inverted F antenna is a single layer antenna.

9. The printed circuit of claim 8, wherein the slanted grounding element is coupled to the radiating element at a 90 degree angle.

10. The printed circuit of claim 8, wherein the slanted grounding element is coupled to the ground plane at a 90 degree angle.

11. The printed circuit of claim 8, further comprising a slot antenna formed by a perimeter of an area enclosed by the radiating element, the feed line, the ground plane, and the slanted grounding element.

12. The printed circuit of claim 11, wherein the slot antenna is configured to operate at one quarter of a wavelength of the inverted F antenna.

13. The printed circuit of claim 8, wherein the radiating element is of a length equal to a rational number times a wavelength of the inverted F antenna.

14. The printed circuit of claim 8, wherein the slanted grounding element is coupled to the radiating element at a 90 degree angle and the slanted grounding element is coupled to the ground plane at a 90 degree angle.

15. An apparatus comprising:
a ground plane extending in a horizontal direction on a planar substrate; and
an inverted F antenna on the substrate, and coupled to the ground plane, the inverted F antenna comprising:
a horizontal radiating element with a first end and a second end extending in a parallel direction to the ground plane;
a feed line directly connected to the first end of the radiating element and extending in a perpendicular direction from the first end of the radiating element;
a slanted grounding element having a third end and a fourth end, wherein the third end is connected to the ground plane at a 90-degree angle using a first extending portion and the fourth end is connected to the radiating element at a 90-degree angle using a second extending portion at a point between the first end and the second end; and
a transmitter integrated circuit coupled to the feed line through a filter network by an electrical feeder path, said feeder path including two conductive traces;
said transmitter integrated circuit occupies space on the ground plane on a same side of the electrical feeder path, such that the electrical feeder path does not cause any parasitic coupling between the transmitter integrated circuit and the radiating element;
wherein the inverted F antenna is a single layer antenna.

16. The apparatus of claim 15, wherein the slanted grounding element is coupled to the radiating element at a 90 degree angle.

17. The apparatus of claim 15, wherein the slanted grounding element is coupled to the ground plane at a 90 degree angle.

18. The apparatus of claim 15, further comprising a slot antenna formed by a perimeter of an area enclosed by the radiating element, the feed line, the ground plane, and the slanted grounding element.

19. The apparatus of claim 18, wherein the slot antenna is configured to operate at one quarter of a wavelength of the inverted F antenna.

20. The apparatus of claim 15, wherein the radiating element is of a length equal to a rational number times a wavelength of the inverted F antenna.

* * * * *